(12) United States Patent
Murata

(10) Patent No.: US 10,580,814 B2
(45) Date of Patent: Mar. 3, 2020

(54) SOLID-STATE IMAGING DEVICE HAVING LIGHT SHIELDING FILMS, METHOD OF MANUFACTURING THE SAME, AND ELECTRONIC APPARATUS

(71) Applicant: SONY CORPORATION, Tokyo (JP)

(72) Inventor: Kenichi Murata, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/083,050

(22) PCT Filed: Mar. 1, 2017

(86) PCT No.: PCT/JP2017/008051
§ 371 (c)(1),
(2) Date: Sep. 7, 2018

(87) PCT Pub. No.: WO2017/159362
PCT Pub. Date: Sep. 21, 2017

(65) Prior Publication Data
US 2019/0103431 A1 Apr. 4, 2019

(30) Foreign Application Priority Data

Mar. 15, 2016 (JP) ................................ 2016-050965

(51) Int. Cl.
*H01L 27/146* (2006.01)
*H01L 27/30* (2006.01)
(Continued)

(52) U.S. Cl.
CPC .. *H01L 27/14623* (2013.01); *H01L 27/14645* (2013.01); *H01L 27/14665* (2013.01);
(Continued)

(58) Field of Classification Search
CPC ................................................. H01L 27/14623
See application file for complete search history.

(56) References Cited

U.S. PATENT DOCUMENTS

| 5,514,888 A * | 5/1996 | Sano ................. H01L 27/14623 |
| | | 257/232 |
| 10,009,564 B2 * | 6/2018 | Oshiyama ......... H01L 27/14623 |

(Continued)

FOREIGN PATENT DOCUMENTS

| JP | 2005-303273 | 10/2005 |
| JP | 2006-344916 | 12/2006 |

(Continued)

OTHER PUBLICATIONS

International Search Report prepared by the Japan Patent Office dated Apr. 17, 2017, for International Application No. PCT/JP2017/008051.

*Primary Examiner* — Quoc D Hoang
(74) *Attorney, Agent, or Firm* — Sheridan Ross P.C.

(57) ABSTRACT

The present technology relates to a solid-state imaging device that can further reduce the influence the film stress generated in an upper electrode has on a photoelectric conversion film, a method of manufacturing the solid-state imaging device, and an electronic apparatus. A solid-state imaging device includes: a photoelectric conversion film formed on the upper side of a semiconductor substrate; and two or more light shielding films formed at positions higher than the photoelectric conversion film with respect to the semiconductor substrate. The present technology can be applied to solid-state imaging devices, electronic apparatuses, and the like, for example.

20 Claims, 9 Drawing Sheets

(51) Int. Cl.
*H01L 31/054* (2014.01)
*H01L 51/44* (2006.01)
*H01L 51/56* (2006.01)
*H01L 31/0256* (2006.01)

(52) U.S. Cl.
CPC ...... *H01L 27/14685* (2013.01); *H01L 27/307* (2013.01); *H01L 31/054* (2014.12); *H01L 51/447* (2013.01); *H01L 51/56* (2013.01); *H01L 27/14627* (2013.01); *H01L 2031/0344* (2013.01)

(56) References Cited

U.S. PATENT DOCUMENTS

| | | |
|---|---|---|
| 2005/0206755 A1 | 9/2005 | Yokoyama et al. |
| 2006/0278896 A1 | 12/2006 | Inoue |
| 2009/0050945 A1 | 2/2009 | Inoue |
| 2011/0156104 A1 | 6/2011 | Yamaguchi et al. |
| 2011/0228148 A1* | 9/2011 | Takata ................. H01L 27/307 348/273 |
| 2015/0194469 A1 | 7/2015 | Joei |

FOREIGN PATENT DOCUMENTS

| | | |
|---|---|---|
| JP | 2011-138927 | 7/2011 |
| JP | 2011-198854 | 10/2011 |
| WO | WO 2014/007132 | 6/2016 |

* cited by examiner

FIG. 7

| NUMBER OF STACKED FILMS | 1 LAYER | | 2 LAYERS | | | |
|---|---|---|---|---|---|---|
| STRUCTURE (UPPER/LOWER) | W | Al | W/Ti | Al/Ti | Al/TiN | TiN/Al |
| THICKNESS OF EACH LAYER | 250nm | 108nm | 200/30nm | 100/5nm | 101/25nm | 30/100nm |
| TOTAL THICKNESS | 250nm | 108nm | 230nm | 105nm | 126nm | 130nm |

| NUMBER OF STACKED FILMS | 3 OR MORE LAYERS | | | | | |
|---|---|---|---|---|---|---|
| STRUCTURE (UPPER/LOWER) | Al/TiN/Ti | TiN/Al/Ti | TiN/Al/TiN/Ti | TiN/Al/TiN | W/Al/Ti | W/Al/W |
| THICKNESS OF EACH LAYER | 93/25/5nm | 30/92/5nm | 30/85/25/5nm | 30/93/25nm | 30/85/5 | 30/85/8nm |
| TOTAL THICKNESS | 123nm | 127nm | 145nm | 148nm | 120nm | 123nm |

SOLID-STATE IMAGING DEVICE HAVING LIGHT SHIELDING FILMS, METHOD OF MANUFACTURING THE SAME, AND ELECTRONIC APPARATUS

CROSS REFERENCE TO RELATED APPLICATIONS

This application is a national stage application under 35 U.S.C. 371 and claims the benefit of PCT Application No. PCT/JP2017/008051 having an international filing date of 1 Mar. 2017, which designated the United States, which PCT application claimed the benefit of Japanese Patent Application No. 2016-050965 filed 15 Mar. 2016, the entire disclosures of each of which are incorporated herein by reference.

TECHNICAL FIELD

The present technology relates to a solid-state imaging device, a method of manufacturing the solid-state imaging device, and an electronic apparatus. More particularly, the present technology relates to a solid-state imaging device that can further reduce the influence the film stress generated in an upper electrode has on a photoelectric conversion film, a method of manufacturing the solid-state imaging device, and an electronic apparatus.

BACKGROUND ART

In a solid-state imaging device that has an organic photoelectric conversion film as a photoelectric conversion unit on the upper side of the semiconductor substrate, the film stress in the upper electrode might locally concentrate on the organic photoelectric conversion film. In this case, there is a possibility that property fluctuations of dark current, white defects, and the like of the organic photoelectric conversion film occur in a conspicuous manner.

To counter this, the technique according to Patent Document 1, for example, is disclosed as a technique for reducing the film stress to be given to an organic photoelectric conversion film by an upper electrode. Patent Document 1 discloses a technique by which a second upper electrode is formed on the outer side of a first upper electrode formed above an organic photoelectric conversion film so that peripheral portions are connected to an insulating film, and the second upper electrode functions as a film stress adjustment unit. With this arrangement, the influence the film stress generated in the upper electrode has on the photoelectric conversion film can be reduced, and property fluctuations of dark current and white defects of the organic photoelectric conversion film can also be reduced.

CITATION LIST

Patent Document

Patent Document 1: Japanese Patent Application Laid-Open No. 2015-56554

SUMMARY OF THE INVENTION

Problems to be Solved by the Invention

However, in a case where a light shielding film is formed as a higher layer than the upper electrode, the technique according to Patent Document 1 is not enough to alleviate the film stress.

The present technology has been made in view of those circumstances, and aims to further reduce the influence the film stress generated in an upper electrode has on a photoelectric conversion film.

Solutions to Problems

A solid-state imaging device according to a first aspect of the present technology includes: a photoelectric conversion film formed on the upper side of a semiconductor substrate; and two or more light shielding films formed at positions higher than the photoelectric conversion film with respect to the semiconductor substrate.

A solid-state imaging device manufacturing method according to a second aspect of the present technology includes: forming a photoelectric conversion film on the upper side of a semiconductor substrate; and forming two or more light shielding films at positions higher than the photoelectric conversion film with respect to the semiconductor substrate.

An electronic apparatus according to a third aspect of the present technology includes a solid-state imaging device that includes: a photoelectric conversion film formed on the upper side of a semiconductor substrate; and two or more light shielding films formed at positions higher than the photoelectric conversion film with respect to the semiconductor substrate.

In the first through third aspects of the present technology, a photoelectric conversion film is formed on the upper side of a semiconductor substrate, and two or more light shielding films are formed at positions higher than the photoelectric conversion film with respect to the semiconductor substrate.

The solid-state imaging device and the electronic apparatus may be independent devices, or may be modules to be incorporated into other apparatuses.

Effects of the Invention

According to the first through third aspects of the present technology, the influence the film stress generated in the upper electrode has on the photoelectric conversion film can be further reduced.

Note that effects of the present technology are not limited to the effects described herein, and may include any of the effects described in the present disclosure.

BRIEF DESCRIPTION OF DRAWINGS

FIG. 7 is a diagram showing an example stack structure of a light shielding film.

MODES FOR CARRYING OUT THE INVENTION

The following is a description of modes (hereinafter referred to as embodiments) for carrying out the present technology. Meanwhile, explanation will be made in the following order.

1. General example configuration of a solid-state imaging device
2. First embodiment of a solid-state imaging device (an example configuration having a plurality of light shielding films via a sealing film)
3. Second embodiment of a solid-state imaging device (an example configuration including an inter-pixel light shielding film)
4. Third embodiment of a solid-state imaging device (an example configuration including a plurality of light shielding films, without any sealing film interposed between the light shielding films)
5. Example Applications to Electronic Apparatuses

1. General Example Configuration of a Solid-State Imaging Device

Figure 1:
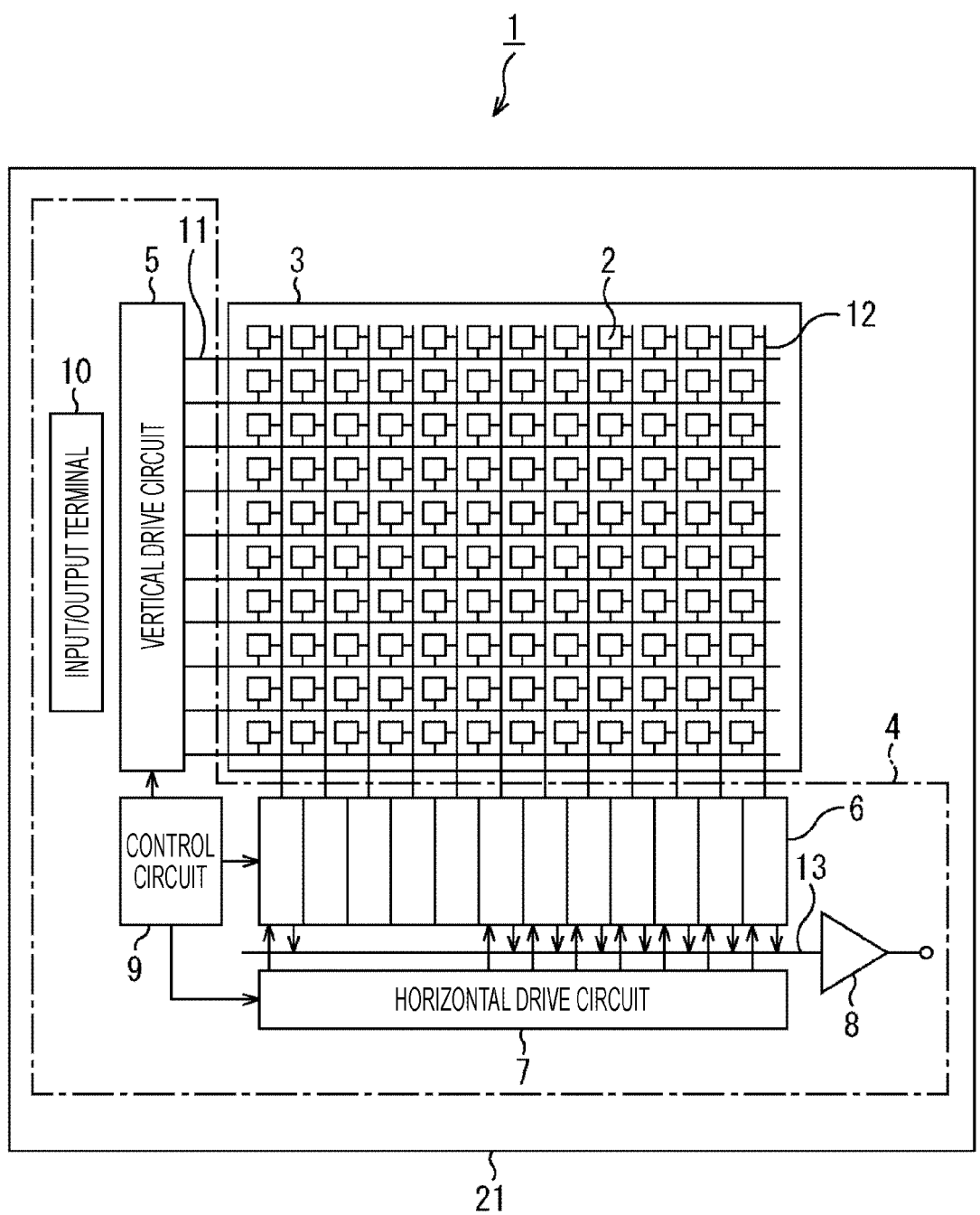
FIG. 1 is a diagram schematically showing the configuration of a solid-state imaging device to which the present technology is applied.

FIG. 1 schematically shows the configuration of a solid-state imaging device to which present technology is applied.

The solid-state imaging device 1 shown in FIG. 1 includes a pixel array unit 3 having pixels 2 arranged in a two-dimensional array on a semiconductor substrate 21 using silicon (Si) as the semiconductor, for example, and a peripheral circuit unit 4 existing around the pixel array unit 3. The peripheral circuit unit 4 includes a vertical drive circuit 5, column signal processing circuits 6, a horizontal drive circuit 7, an output circuit 8, a control circuit 9, and the like.

The pixels 2 each include a photoelectric conversion unit that photoelectrically converts incident light, and a plurality of pixel transistors. The pixel transistors are formed with the four MOS transistors: a transfer transistor, a select transistor, a reset transistor, and an amplification transistor, for example.

The control circuit 9 receives an input clock and data that designates an operation mode and the like, and also outputs data such as internal information about the solid-state imaging device 1. Specifically, in accordance with a vertical synchronization signal, a horizontal synchronization signal, and a master clock, the control circuit 9 generates a clock signal and a control signal that serve as the references for operations of the vertical drive circuit 5, the column signal processing circuits 6, the horizontal drive circuit 7, and the like. The control circuit 9 then outputs the generated clock signal and control signal to the vertical drive circuit 5, the column signal processing circuits 6, the horizontal drive circuit 7, and the like.

The vertical drive circuit 5 is formed with a shift register, for example, selects a predetermined pixel drive line 11, supplies a pulse for driving the pixels 2 connected to the selected pixel drive line 11, and drives the pixels 2 on a row-by-row basis. Specifically, the vertical drive circuit 5 sequentially selects and scans the respective pixels 2 of the pixel array unit 3 on a row-by-row basis in the vertical direction, and supplies pixel signals based on the signal charges generated in accordance with the amounts of light received in the photoelectric conversion units of the respective pixels 2, to the column signal processing circuits 6 through vertical signal lines 12.

The column signal processing circuits 6 are provided for the respective columns of the pixels 2, and perform signal processing such as denoising, on a column-by-column basis, on signals that are output from the pixels 2 of one row. For example, the column signal processing circuits 6 perform signal processing such as correlated double sampling (CDS) for removing fixed pattern noise inherent to pixels, and AD conversion.

The horizontal drive circuit 7 is formed with a shift register, for example. The horizontal drive circuit 7 sequentially selects the respective column signal processing circuits 6 by sequentially outputting horizontal scan pulses, and causes the respective column signal processing circuits 6 to output pixel signals to a horizontal signal line 13.

The output circuit 8 performs signal processing on signals sequentially supplied from the respective column signal processing circuits 6 through the horizontal signal line 13, and outputs the processed signals. The output circuit 8 might perform only buffering, or might perform black level control, column variation correction, various kinds of digital signal processing, and the like, for example. An input/output terminal 10 exchanges signals with the outside.

The solid-state imaging device 1 having the above structure is a so-called column AD-type CMOS image sensor in which the column signal processing circuits 5 that perform CDS and AD conversion are provided for the respective pixel columns.

2. First Embodiment of a Solid-State Imaging Device

Figure 2:
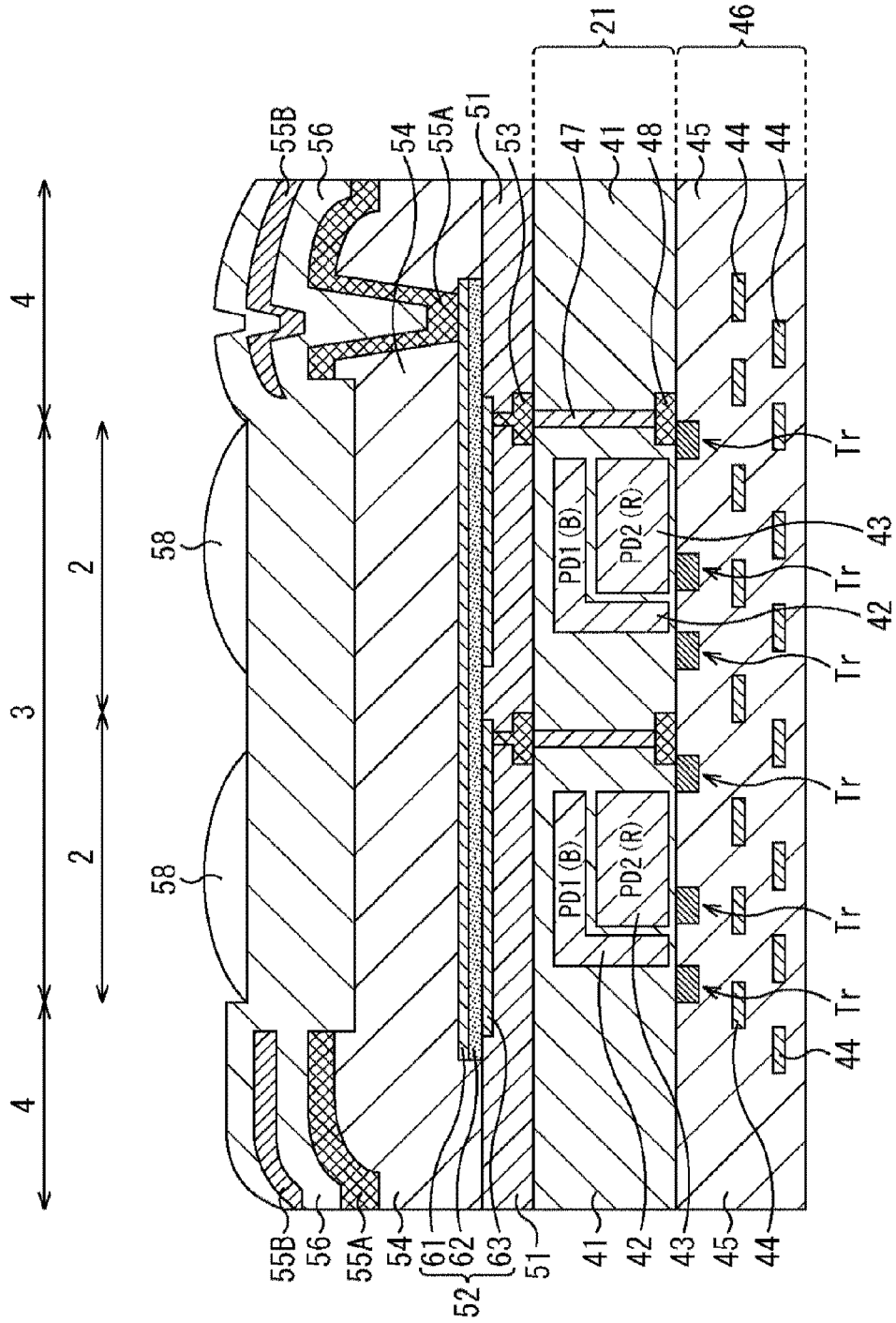
FIG. 2 is a diagram showing an example cross-sectional configuration according to a first embodiment of a solid-state imaging device.

FIG. 2 is a diagram showing an example cross-sectional configuration according to a first embodiment of a solid-state imaging device.

Note that the pixel array unit 3 shown in FIG. 2 is a pixel cross-sectional structure of two pixels due to space limitation.

The semiconductor substrate 21 is formed with a semiconductor region 41 of a first conductivity type (the P-type, for example) and semiconductor regions 42 and 43 of a second conductivity type (the N-type, for example). As the semiconductor regions 42 and 43 of the second conductivity type are stacked in the depth direction on a pixel-by-pixel basis in the semiconductor region 41 of the first conductivity type, photodiodes PD1 and PD2 are formed with PN junctions in the depth direction. The photodiode PD1 having the semiconductor region 42 as the charge accumulation region is a photoelectric conversion unit that receives blue light and performs photoelectric conversion, and the photodiode PD2 having the semiconductor region 43 as the charge accumulation region is a photoelectric conversion unit that receives red light and performs photoelectric conversion.

A multilayer wiring layer 46 formed with a plurality of pixel transistors Tr that perform reading of charges accumulated in the photodiodes PD1 and PD2, and the like, a plurality of wiring layers 44, and an interlayer insulating film 45 is formed on the front surface side of the semiconductor substrate 21, which is the lower side in FIG. 2.

Meanwhile, a photoelectric conversion unit 52 is formed on the back surface side of the semiconductor substrate 21, which is the upper side in FIG. 2, via a transparent insulating film 51. The photoelectric conversion unit 52 is formed by stacking an upper electrode 61, a photoelectric conversion film 62, and a lower electrode 63, and the photoelectric conversion film 62 is interposed between the upper electrode 61 and the lower electrode 63. The upper electrode 61 is formed to be shared by all the pixels of the pixel array unit 3, and the lower electrode 63 is formed separately for each pixel of the pixel array unit 3.

The transparent insulating film 51 is formed with one or a plurality of layers using a material such as silicon oxide (SiO2), silicon nitride (SiN), silicon oxynitride (SiON), or hafnium oxide (HfO2), for example.

A transparent conductive material such as indium tin oxide (ITO), zinc oxide, or indium zinc oxide, for example, is used as the material of the upper electrode 61 and the lower electrode 63. The upper electrode 61 and the lower electrode 63 are designed to have a thickness of about 50 nm, for example.

The photoelectric conversion film 62 receives green light, and performs photoelectric conversion. In the photoelectric conversion film 62, an example of the material sensitive only to green light is a combination of organic materials that are a quinacridone compound (an electron-donating material) and a perylene compound (an electron-accepting material), for example. The photoelectric conversion film 62 is designed to have a thickness of about 155 nm, for example.

The lower electrode 63 is connected to metal wiring lines 53 penetrating the transparent insulating film 51, and the metal wiring lines 53 are connected to conductive plugs 47 penetrating the semiconductor region 41 of the semiconductor substrate 21. The metal wiring lines 53 are formed with a material, such as tungsten (W), aluminum (Al), or copper (Cu).

The conductive plugs 47 are connected to charge accumulation portions 48 formed in a semiconductor region of the second conductivity type (the N-type, for example) in the vicinity of the interface on the front surface side of the semiconductor region 41. Note that, although not shown in the drawings, the outer circumferences of the conductive plugs 47 are insulated with an insulating film of SiO2, SiN, or the like.

The electric charges generated through photoelectric conversion in the photoelectric conversion unit 52 are transferred to the charge accumulation portions 48 via the metal wiring lines 53 and the conductive plugs 47. The charge accumulation portions 48 temporarily accumulate the electric charges photoelectrically converted by the photoelectric conversion unit 52, until the electric charges are read out.

A sealing film (protective film) 54 is formed on the upper side of the upper electrode 61 of the pixel array unit 3 and on the upper side of the transparent insulating film 51 of the peripheral circuit unit 4. Further, a first light shielding film 55A and a second light shielding film 55B are stacked above the sealing film 54 via a sealing film (protective film) 56 interposed therebetween.

The respective thicknesses of the first light shielding film 55A and the second light shielding film 55B are set so as to achieve a light-shielding function with the total thickness of these two films. As a light shielding film 55 is formed and divided into a plurality of layers as described above, it is possible to alleviate the stress at the time of formation of the respective light shielding films 55 of the first light shielding film 55A and the second light shielding film 55B.

The sealing films 54 and 56 are formed with an inorganic material having optical transparency. For example, the sealing films 54 and 56 are formed with single-layer films including silicon nitride (SiN), silicon oxynitride (SiON), aluminum oxide (AlO), aluminum nitride (AlN), or the like, or film stacks of two or more of those films.

As shown in FIG. 2, the first light shielding film 55A, which is the lower one of the first light shielding film 55A and the second light shielding film 55B, and is closer to the photoelectric conversion unit 52, is connected to the upper electrode 61 at a predetermined position of the peripheral circuit unit 4, and also serves as a metal wiring line for applying a predetermined bias voltage to the upper electrode 61. A material having a low transmittance with respect to visible light, such as tungsten (W), titanium (Ti), aluminum (Al), or copper (Cu), for example, is used as the material of the first light shielding film 55A and the second light shielding film 55B, but this aspect will be described later in detail.

In the pixel array unit 3, an on-chip lens 58 is formed for each pixel on the sealing film 56. A silicon nitride (SiN) film, or a resin material such as a styrene resin, an acrylic resin, a styrene-acrylic copolymer resin, or a siloxane resin, for example, is used as the material of the on-chip lenses 58. The sealing film 56 and the on-chip lenses 58 can be formed with the same material.

The solid-state imaging device 1 formed as described above is a back-illuminated CMOS solid-state imaging device in which light enters from the back surface side on the opposite side from the front surface side of the semiconductor substrate 21 having the pixel transistors Tr formed thereon.

As shown in FIG. 2, in the solid-state imaging device 1 according to the first embodiment, the light shielding film 55 is formed at a higher position than the photoelectric conversion film 62 with respect to the semiconductor substrate 21, and is formed with a plurality of layers that are the first light shielding film 55A and the second light shielding film 55B. With this arrangement, even in a case where the light shielding film 55 is formed above the upper electrode 61 of the photoelectric conversion unit 52, it is possible to reduce the influence the film stress generated in the upper electrode 61 has on the photoelectric conversion film 62. Further, as the influence the film stress generated in the upper electrode 61 has on the photoelectric conversion film 62 is reduced, property fluctuations of dark current and white defects of the photoelectric conversion film 62 can also be reduced.

<Manufacturing Method>

Figure 3:
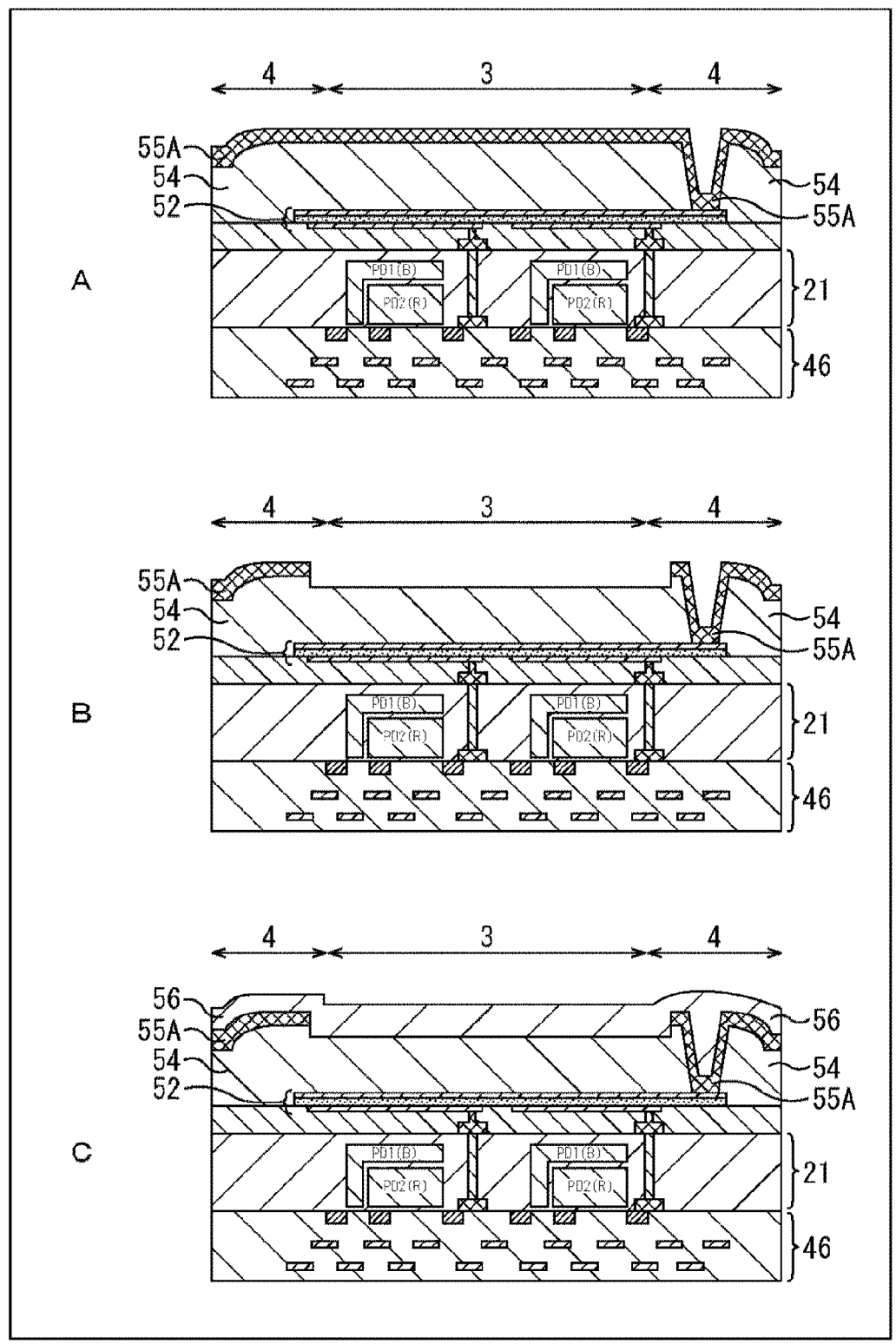
FIG. 3 is a diagram for explaining a method of manufacturing the solid-state imaging device according to the first embodiment.
Figure 4:
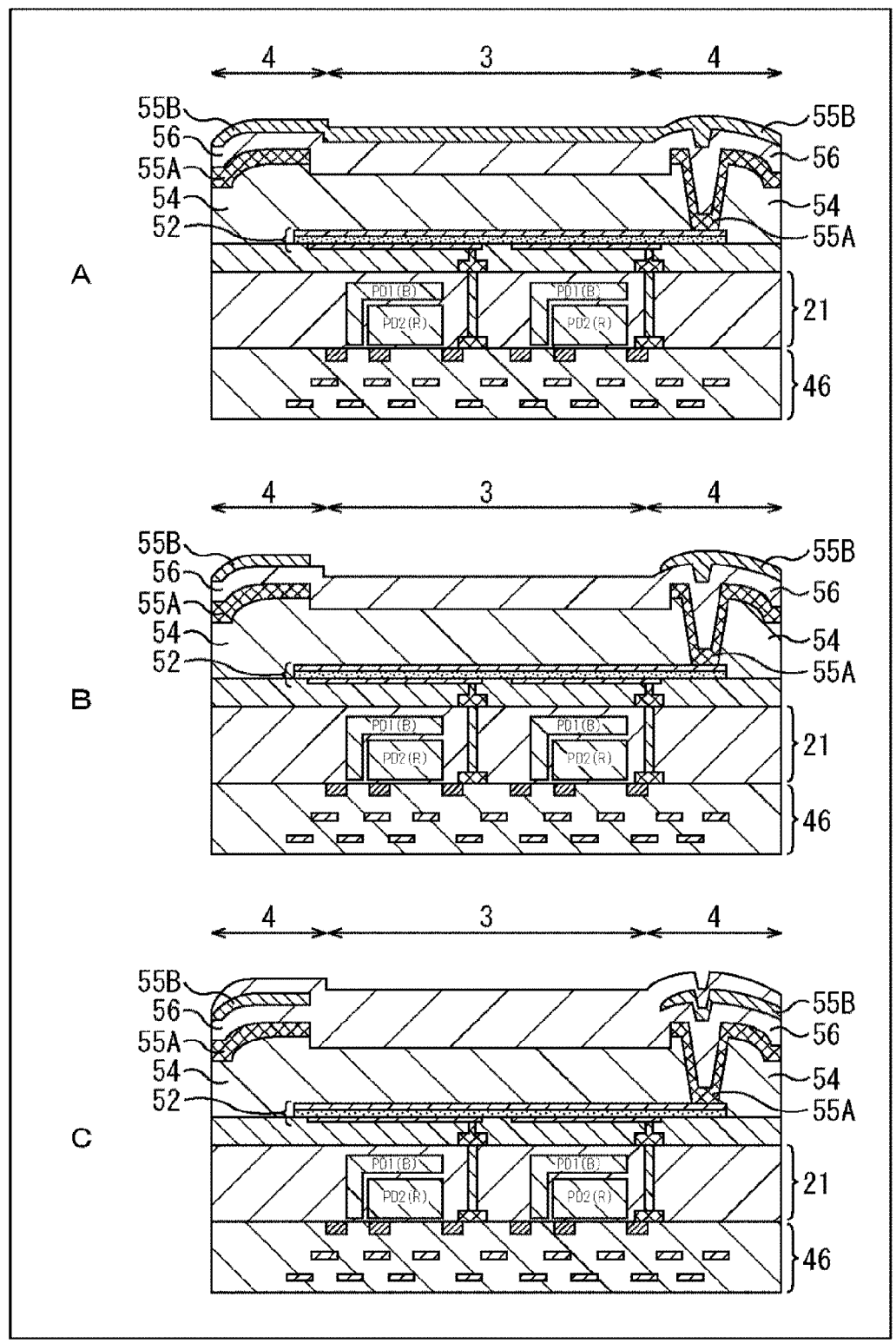
FIG. 4 is a diagram for explaining a method of manufacturing the solid-state imaging device according to the first embodiment.

Referring now to FIGS. 3 and 4, a method of manufacturing the solid-state imaging device 1 according to the first embodiment shown in FIG. 2 is described.

First, as shown in A of FIG. 3, after the photodiodes PD1 and PD2, the conductive plugs 47, and the like are formed in a predetermined region of the semiconductor substrate 21, the multilayer wiring layer 46 including the plurality of pixel transistors Tr is formed on the front surface side of the semiconductor substrate 21.

After that, the photoelectric conversion unit 52 and the sealing film 54 are formed on the back surface side of the semiconductor substrate 21. At a predetermined position in the peripheral circuit unit 4, an opening is then formed in the sealing film 54, so that the upper electrode 61 is exposed. The first light shielding film 55A is then formed by a sputtering method or a chemical vapor deposition (CVD) method, for example, so as to cover the upper surface of the sealing film 54 including the opening portion.

As shown in B of FIG. 3, of the first light shielding film 55A formed on the entire planar region of the pixel array unit 3 and the peripheral circuit unit 4, the portion located in the pixel array unit 3 is removed, together with the portion of the sealing film 54 located under the portion of the first light shielding film 55A, by etching.

Next, as shown in C of FIG. 3, the sealing film 56 is formed on the entire planar region of the pixel array unit 3 and the peripheral circuit unit 4 by a plasma CVD method, for example.

Next, as shown in A of FIG. 4, the second light shielding film 55B to be the second layer of the light shielding film 55 is formed on the upper surface of the formed sealing film 56 by a sputtering method or a CVD method, for example.

As shown in B of FIG. 4, of the second light shielding film 55B formed on the entire surface, the portion located in the pixel array unit 3 is then subjected to etching. After that, as shown in C of FIG. 4, the sealing film 56 is again formed on the entire planar region of the pixel array unit 3 and the peripheral circuit unit 4.

After C of FIG. 4, the on-chip lenses 58 for the respective pixels are formed on the upper surface of the sealing film 56 in the pixel array unit 3. Thus, the solid-state imaging device 1 shown in FIG. 2 is completed.

The film stress of the light shielding film 55 increases as the thickness of the light shielding film 55 becomes greater. Also, the film stress of the light shielding film 55 is alleviated when the light shielding film 55 in the pixel array unit 3 is removed by etching. Therefore, the light shielding layer is formed as a two-layer structure of the first light shielding film 55A and the second light shielding film 55B, the thickness of each layer is reduced, and the formation and the etching of the light shielding film 55 are repeatedly performed. Thus, the photoelectric conversion film 62 can be protected from a large stress at the time of the formation of the light shielding layer.

3. Second Embodiment of a Solid-State Imaging Device

Figure 5:
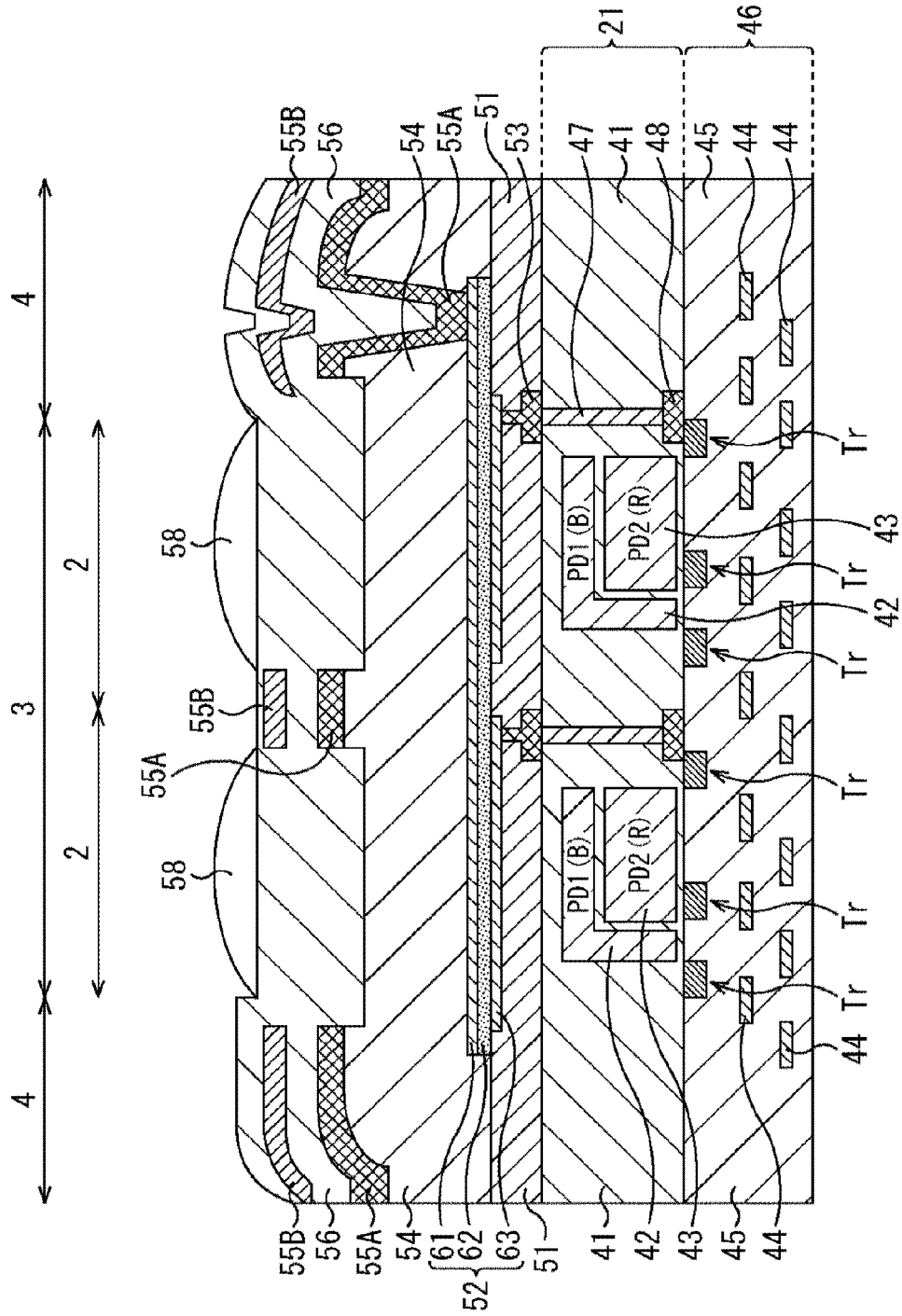
FIG. 5 is a diagram showing an example cross-sectional configuration according to a second embodiment of a solid-state imaging device.

FIG. 5 is a diagram showing an example cross-sectional configuration according to a second embodiment of a solid-state imaging device.

Note that, in FIG. 5, the components equivalent to those of the first embodiment shown in FIG. 2 are denoted by the same reference numerals as those used in FIG. 2, and explanation of them will not be unnecessarily repeated.

The second embodiment shown in FIG. 5 differs from the above described first embodiment in that first light shielding film 55A and the second light shielding film 55B are also formed between the pixels that are the boundaries between the respective pixels 2 of the pixel array unit 3, and the first light shielding film 55A and the second light shielding film 55B each further have the functions of an inter-pixel light shielding film. Other aspects of the configuration are similar to those of the above described first embodiment.

In other words, in the above described first embodiment, the first light shielding film 55A and the second light shielding film 55B have an opening in the entire region of the effective pixel region of the pixel array unit 3. In the second embodiment shown in FIG. 5, on the other hand, the effective pixel region of the pixel array unit 3 has openings for the respective pixels.

In the second embodiment as described above, the light shielding film 55 is also divided into a plurality of layers and is formed with the first light shielding film 55A and the second light shielding film 55B. Thus, it is possible to reduce the influence the film stress generated in the upper electrode 61 has on the photoelectric conversion film 62. Further, as the influence the film stress generated in the upper electrode 61 has on the photoelectric conversion film 62 is reduced, property fluctuations of dark current and white defects of the photoelectric conversion film 62 can also be reduced.

4. Third Embodiment of a Solid-State Imaging Device

Figure 6:
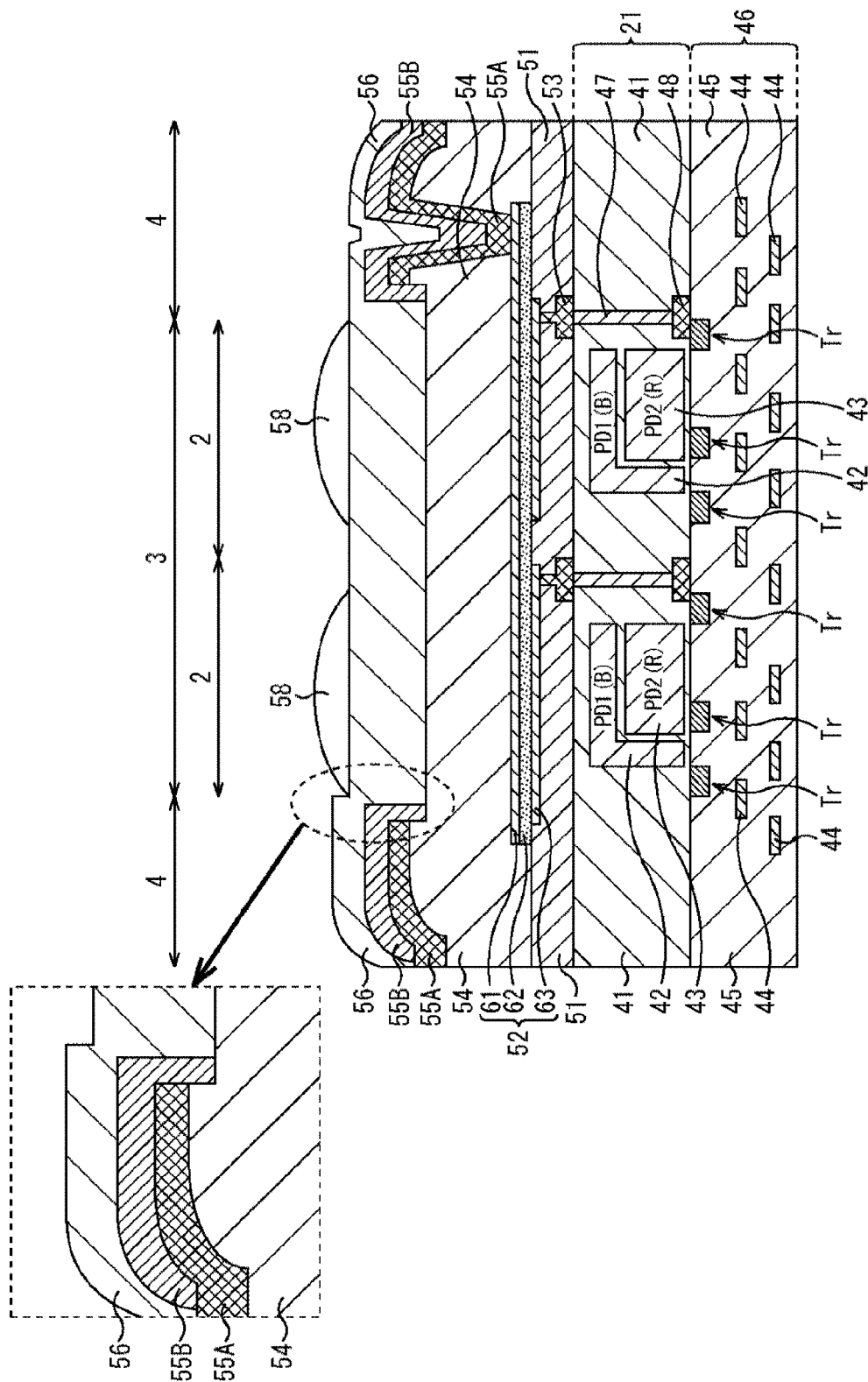
FIG. 6 is a diagram showing an example cross-sectional configuration according to a third embodiment of a solid-state imaging device.

FIG. 6 is a diagram showing an example cross-sectional configuration according to a third embodiment of a solid-state imaging device.

Note that, in FIG. 6, the components equivalent to those of the first embodiment shown in FIG. 2 are also denoted by the same reference numerals as those used in FIG. 2, and explanation of them will not be unnecessarily repeated.

In the first embodiment shown in FIG. 2, the sealing film 56 is formed between the first light shielding film 55A and the second light shielding film 55B. In the third embodiment shown in FIG. 6, on the other hand, the sealing film 56 is not formed between the first light shielding film 55A and the second light shielding film 55B, and the first light shielding film 55A and the second light shielding film 55B are directly attached to each other in the stack structure, which differs from the above described first embodiment. The third embodiment also differs from the above described first embodiment in that the second light shielding film 55B covers the end face of the first light shielding film 55A on the side of the pixel array unit 3, which is the effective pixel region side. Other aspects of the configuration are similar to those of the above described first embodiment.

The reason that the end face of the first light shielding film 55A on the effective pixel region side is covered with the second light shielding film 55B is that, when etching is performed on the first light shielding film 55A, the portion of the sealing film 54 located under the first light shielding film 55A is also removed.

In the third embodiment as described above, the light shielding film 55 is also divided into a plurality of layers and is formed with the first light shielding film 55A and the second light shielding film 55B. Thus, it is possible to reduce the influence the film stress generated in the upper electrode 61 has on the photoelectric conversion film 62. Further, as the influence the film stress generated in the upper electrode 61 has on the photoelectric conversion film 62 is reduced, property fluctuations of dark current and white defects of the photoelectric conversion film 62 can also be reduced.

<Example Configuration of a Light Shielding Film>

FIG. 7 shows an example of the stack structure of a single-layer light shielding film 55 that can be adopted as a first light shielding film 55A or a second light shielding film 55B.

As shown in FIG. 7, the first light shielding film 55A or the second light shielding film 55B can be formed as a single-layer structure using one material such as tungsten (W) or aluminum (Al), or can be formed as a two-layer structure using two materials, such as a two-layer structure of tungsten and titanium (W/Ti) or a two-layer structure of aluminum and titanium (Al/Ti), for example. Furthermore, the first light shielding film 55A or the second light shielding film 55B can be formed as a three- or four-layer structure using two or more materials, such as a three-layer structure of aluminum, TiN, and titanium (Al/TiN/Ti), or a four-layer structure of TiN, aluminum, TiN, and titanium (TiN/Al/TiN/Ti).

As for the thickness of the light shielding film 55, in a case where the first light shielding film 55A or the second light shielding film 55B is formed with one layer of tungsten, for example, the thickness that satisfies the light shielding function is 250 nm, as shown in FIG. 7. In a case where the first light shielding film 55A or the second light shielding film 55B is formed with one layer of aluminum, the thickness is 108 nm. In this manner, the total thickness of the single-layer light shielding film 55 varies depending on the adopted materials and the adopted combination of materials.

Although the thicknesses of the first light shielding film 55A and the second light shielding film 55B may be the same, the thickness of the first light shielding film 55A on the lower side is preferably thinner. The material(s) and the stack structure (the number of layers) may be either the same or different between the first light shielding film 55A and the second light shielding film 55B.

5. Example Applications to Electronic Apparatuses

The present technology is not necessarily applied to a solid-state imaging device. Specifically, the present technology can be applied to any electronic apparatus using a solid-state imaging device as an image capturing unit (a photoelectric conversion unit), such as an imaging apparatus like a digital still camera, a video camera, or the like, a mobile terminal device having an imaging function, or a copying machine using a solid-state imaging device as the image reader. A solid-state imaging device may be in the form of a single chip, or may be in the form of a module that is formed by packaging an imaging unit and a signal processing unit or an optical system, and has an imaging function.

Figure 8:
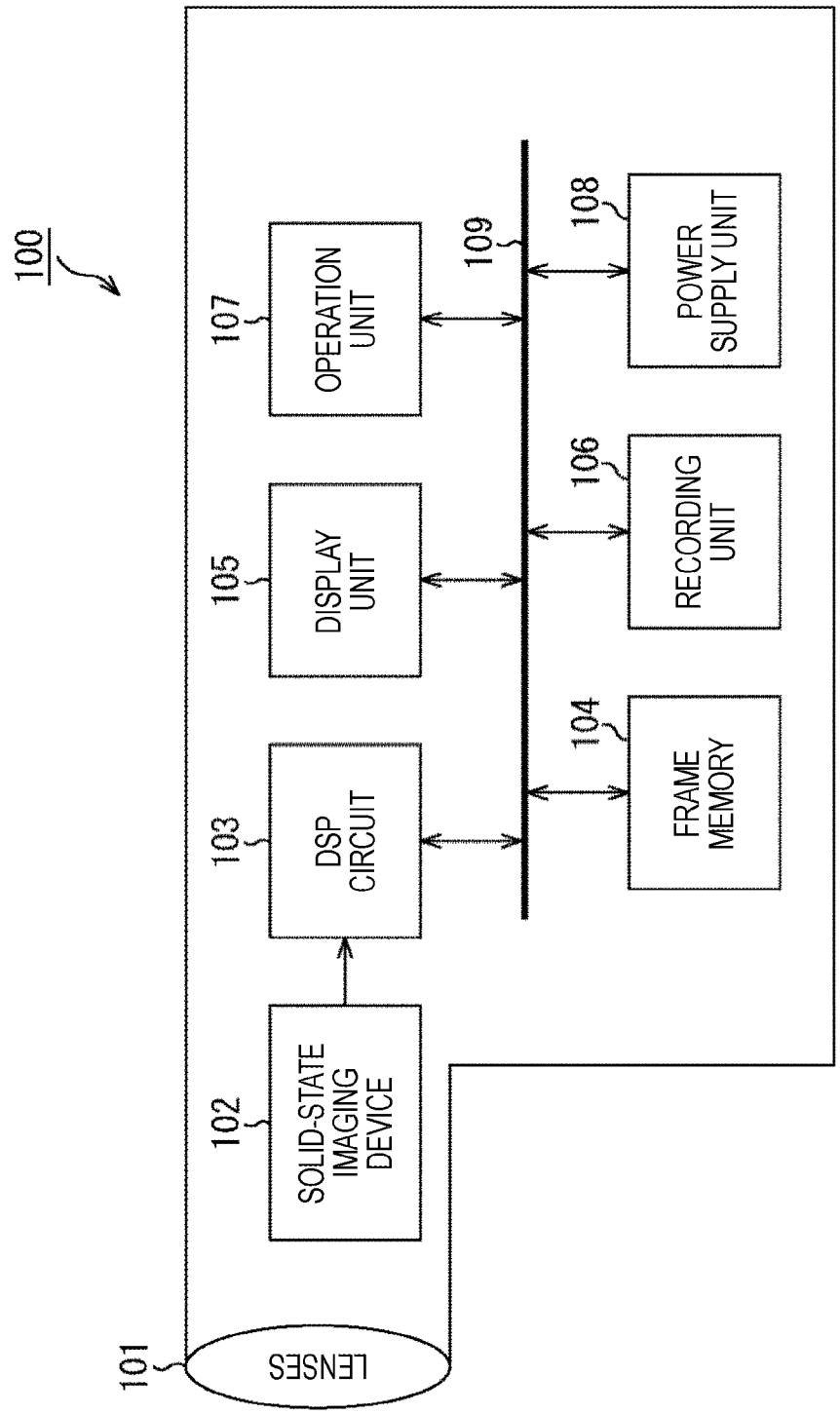
FIG. 8 is a block diagram showing an example configuration of an imaging apparatus as an electronic apparatus to which the present technology is applied.

FIG. 8 is a block diagram showing an example configuration of an imaging apparatus as an electronic apparatus to which the present technology is applied.

The imaging apparatus 100 shown in FIG. 8 includes an optical unit 101 formed with lenses and the like, a solid-state imaging device (an imaging device) 102 having the configuration of the solid-state imaging device 1 shown in FIG. 1, and a digital signal processor (DSP) circuit 103 that is a camera signal processor circuit. The imaging apparatus 100 also includes a frame memory 104, a display unit 105, a recording unit 106, an operation unit 107, and a power supply unit 108. The DSP circuit 103, the frame memory 104, the display unit 105, the recording unit 106, the operation unit 107, and the power supply unit 108 are connected to one another via a bus line 109.

The optical unit 101 gathers incident light (image light) from an object, and forms an image on the imaging surface of the solid-state imaging device 102. The solid-state imaging device 102 converts the amount of the incident light, which has been gathered as the image on the imaging surface by the optical unit 101, into an electrical signal for each pixel, and outputs the electrical signal as a pixel signal. This solid-state imaging device 102 can be the solid-state imaging device 1 shown in FIG. 1, which is a solid-state imaging device in which the light shielding layer is divided into a plurality of light shielding films 55 (the first light shielding film 55A and the second light shielding film 55B), so that the influence the film stress to be generated in the upper electrode 61 of the photoelectric conversion unit 52 has on the photoelectric conversion film 62 is reduced.

The display unit 105 is formed with a flat-panel display such as a liquid crystal display (LCD) or an organic electroluminescence (EL) display, for example, and displays a moving image or a still image formed by the solid-state imaging device 102. The recording unit 106 records the moving image or the still image formed by the solid-state imaging device 102 into a recording medium such as a hard disk or a semiconductor memory.

When operated by a user, the operation unit 107 issues operating instructions as to various functions of the imaging apparatus 100. The power supply unit 108 supplies various power sources as the operation power sources for the DSP circuit 103, the frame memory 104, the display unit 105, the recording unit 106, and the operation unit 107, as appropriate.

As described above, the solid-state imaging device 1 to which one of the above described embodiments or a combination the embodiments is applied is used as the solid-state imaging device 102. Thus, it is possible to reduce the influence the film stress generated in the upper electrode 61 of the photoelectric conversion unit 52 has on the photoelectric conversion film 62. Further, as the influence the film stress generated in the upper electrode 61 has on the photoelectric conversion film 62 is reduced, property fluctuations of dark current and white defects of the photoelectric conversion film 62 can also be reduced. Accordingly, the quality of captured images can also be increased in the imaging apparatus 100, which is a video camera, a digital still camera, a cameral module for mobile devices such as portable telephone devices, or the like.

<Examples of Use of an Image Sensor>

Figure 9:
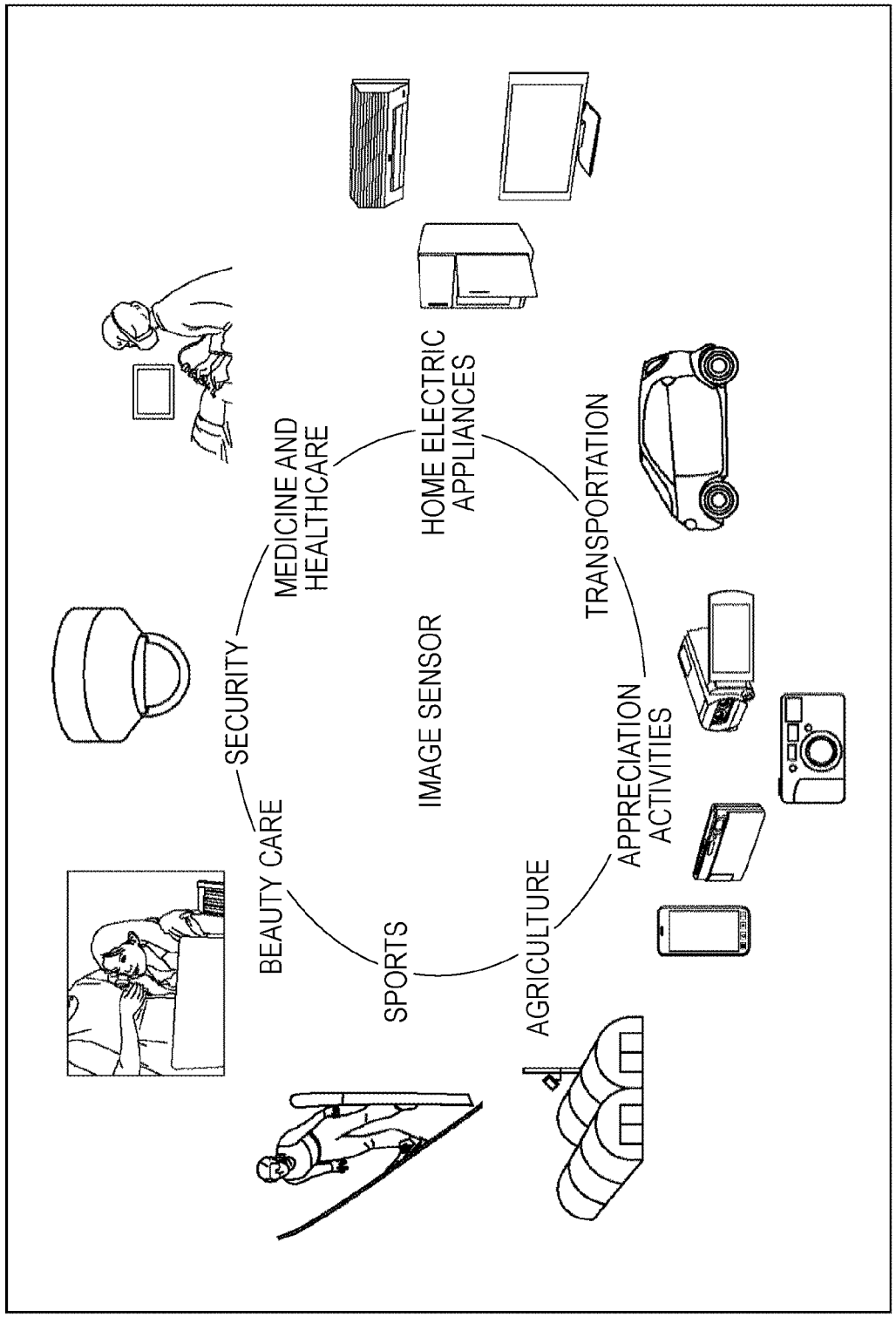
FIG. 9 is a diagram for explaining examples of use of an image sensor.

FIG. 9 is a diagram showing examples of use of an image sensor using the above described solid-state imaging device 1.

An image sensor using the above described solid-state imaging device 1 can be used in various cases where light, such as visible light, infrared light, ultraviolet light, or X-rays, is to be sensed, as listed below, for example.

Devices configured to take images for appreciation activities, such as digital cameras and portable devices with camera functions.

Devices for transportation use, such as vehicle-mounted sensors configured to take images of the front, the back, the surroundings, the inside, and the like of an automobile to perform safe driving such as an automatic stop or recognize a driver's condition and the like, surveillance cameras for monitoring running vehicles and roads, and ranging sensors for measuring distances between vehicles or the like.

Devices to be used in conjunction with home electric appliances, such as television sets, refrigerators, and air conditioners, to take images of gestures of users and operate the appliances in accordance with the gestures.

Devices for medical care use and health care use, such as endoscopes and devices for receiving infrared light for angiography.

Devices for security use, such as surveillance cameras for crime prevention and cameras for personal authentication.

Devices for beauty care use, such as skin measurement devices configured to take images of the skin and microscopes for imaging the scalp.

Devices for sporting use, such as action cameras and wearable cameras for sports and the like.

Devices for agricultural use such as cameras for monitoring conditions of fields and crops.

Embodiments of the present technology are not limited to the above described embodiments, and various modifications can be made to them without departing from the scope of the present technology.

For example, it is possible to adopt a combination of all or some of the above described embodiments.

Further, for example, in the above described examples in the respective embodiments, the light shielding layer has a two-layer structure of the first light shielding film 55A and the second light shielding film 55B. However, the light shielding layer may be divided into three or more layers.

The above described solid-state imaging device 1 is a vertical spectroscopic solid-state imaging device that photoelectrically converts green wavelength light with the photoelectric conversion unit 52 formed outside the semiconductor substrate 21, and photoelectrically converts blue and red wavelength light with the photodiodes PD1 and PD2 in the semiconductor substrate 21, for example. Instead of such a vertical spectroscopic solid-state imaging device, the solid-state imaging device 1 can also adopt a configuration in which a so-called panchromatic film having sensitivity over the entire wavelength range of visible light is used as the photoelectric conversion film 62, and color filters in the Bayer array or the like are formed above the photoelectric conversion film 62. In this case, the photodiodes PD1 and PD2 are not formed in the semiconductor substrate 21, and accordingly, the lower electrode 63 can be formed with a metal such as aluminum, vanadium, gold, silver, platinum, iron, cobalt, carbon, nickel, tungsten, palladium, magnesium, calcium, tin, lead, titanium, yttrium, lithium, ruthenium, or manganese, or an alloy of some of those alloys, for example.

Also, in the above described solid-state imaging device 1, the photoelectric conversion unit 52 formed outside the semiconductor substrate 21 photoelectrically converts green wavelength light. However, the photoelectric conversion unit 52 may be designed to photoelectrically convert light of wavelength of some other color. In other words, in the vertical spectroscopic solid-state imaging device 1, the colors of wavelength light to be photoelectrically converted by the three photoelectric conversion units may be switched as appropriate.

The material in a case where the photoelectric conversion unit 52 is formed with a photoelectric conversion film 62 having sensitivity only to red can be a combination of organic materials including a phthalocyanine compound (an electron-donating material) and a fluorine-substituted phthalocyanine compound (an electron-accepting material), for example.

The material in a case where the photoelectric conversion unit 52 is formed with a photoelectric conversion film 62 having sensitivity only to blue can be a combination of organic materials including a coumarin compound (an electron-donating material) and a silole compound (an electron-accepting material), for example.

Alternatively, instead of an organic photoelectric conversion material, an inorganic photoelectric conversion material may be adopted as the material of the photoelectric conversion film 62. Examples of such inorganic photoelectric conversion materials include crystalline silicon, amorphous silicon, CIGS (Cu, In, Ga, and Se compounds), CIS (Cu, In, and Se compounds), chalcopyrite structured semiconductors, and compound semiconductors such as GaAs.

In the above described examples, the solid-state imaging device 1 is formed with the single semiconductor substrate 21. However, the solid-state imaging device 1 may be a stack structure formed with two or three semiconductor substrates.

In the solid-state imaging devices in the above described examples, the first conductivity type is the P-type, the second conductivity type is the N-type, and electrons are used as signal charges. However, the present technology can also be applied to solid-state imaging devices in which holes are used as signal charges. That is, the first conductivity type can be the N-type, the second conductivity type can be the P-type, and the conductivity types of the above described respective semiconductor regions can be reversed.

The present technology can be applied not only to solid-state imaging devices that sense an incident light quantity distribution of visible light and form an image in accordance with the distribution, but also to solid-state imaging devices (physical quantity distribution sensors) in general, such as a solid-state imaging device that senses an incident quantity distribution of infrared rays, X-rays, particles, or the like, and forms an image in accordance with the distribution, or a fingerprint sensor that senses a distribution of some other physical quantity in a broad sense, such as pressure or capacitance, and forms an image in accordance with the distribution.

Furthermore, the present technology can be applied not only to solid-state imaging devices but also to semiconductor devices having some other semiconductor integrated circuits.

Note that the advantageous effects described in this specification are merely examples, and the advantageous effects of the present technology are not limited to them and may include effects other than those described in this specification.

Note that the present technology can also be embodied in the configurations described below.

(1)

A solid-state imaging device including:

a photoelectric conversion film formed on an upper side of a semiconductor substrate; and at least two light shielding films formed at positions higher than the photoelectric conversion film with respect to the semiconductor substrate.

(2)

The solid-state imaging device according to (1), in which the at least two light shielding films have an opening in an entire region of an effective pixel region.

(3)

The solid-state imaging device according to (1), in which the at least two light shielding films have openings for respective pixels in an effective pixel region, and include an inter-pixel light shielding film.

(4)

The solid-state imaging device according to any of (1) to (3), further including a sealing film between respective light shielding films of the at least two light shielding films.

(5)

The solid-state imaging device according to any of (1) to (3), in which the at least two light shielding films are stacked, without another layer being interposed between the at least two light shielding films.

(6)

The solid-state imaging device according to (5), in which the at least two light shielding films are formed with two light shielding films, the two light shielding films being a first light shielding film on a side of the semiconductor substrate and a second light shielding film formed on a light incident side of the first light shielding film, and an end face of the first light shielding film on an effective pixel region side is covered with the second light shielding film.

(7)

The solid-state imaging device according to any of (1) to (6), in which the at least two light shielding films are formed with two light shielding films.

(8)

The solid-state imaging device according to any of (1) to (7), in which the photoelectric conversion film is an organic photoelectric conversion film containing an organic material.

(9)

A method of manufacturing a solid-state imaging device, including:
forming a photoelectric conversion film on an upper side of a semiconductor substrate; and
forming at least two light shielding films at positions higher than the photoelectric conversion film with respect to the semiconductor substrate.

(10)

An electronic apparatus including
a solid-state imaging device including:
a photoelectric conversion film formed on an upper side of a semiconductor substrate; and
at least two light shielding films formed at positions higher than the photoelectric conversion film with respect to the semiconductor substrate.

REFERENCE SIGNS LIST

1 Solid-state imaging device
2 Pixel
3 Pixel array unit
21 Semiconductor substrate
41 through 43 Semiconductor region
46 Multilayer wiring layer
51 Transparent insulating film
52 Photoelectric conversion unit
56 Sealing film
55A First light shielding film
55B Second light shielding film
55 Light shielding film
56 Sealing film
61 Upper electrode
62 Photoelectric conversion film
63 Lower electrode
100 Imaging apparatus
102 Solid-state imaging device

What is claimed is:

1. A solid-state imaging device comprising:
a photoelectric conversion film formed on an upper side of a semiconductor substrate; and
at least two light shielding films formed at positions higher than the photoelectric conversion film with respect to the semiconductor substrate,
wherein one of the at least two light shielding films covers an end face on an effective pixel region side of another one of the at least two light shielding films.

2. The solid-state imaging device according to claim 1, wherein the at least two light shielding films have an opening in an entire region of the effective pixel region.

3. The solid-state imaging device according to claim 1, wherein the at least two light shielding films have openings for respective pixels in the effective pixel region, and include an inter-pixel light shielding film.

4. The solid-state imaging device according to claim 1, further comprising a sealing film between respective light shielding films of the at least two light shielding films.

5. The solid-state imaging device according to claim 1, wherein the at least two light shielding films are stacked, without another layer being interposed between the at least two light shielding films.

6. The solid-state imaging device according to claim 1, wherein the at least two light shielding films are formed with two light shielding films, the two light shielding films being a first light shielding film on a side of the semiconductor substrate and a second light shielding film formed on a light incident side of the first light shielding film.

7. The solid-state imaging device according to claim 6, wherein a thickness of the first light shielding film is thinner than a thickness of the second light shielding film.

8. The solid-state imaging device according to claim 1, wherein the at least two light shielding films are formed with two light shielding films.

9. The solid-state imaging device according to claim 1, wherein the photoelectric conversion film is an organic photoelectric conversion film containing an organic material.

10. The solid-state imaging device according to claim 1, wherein each of the at least two light shielding films has a same thickness.

11. The solid-state imaging device according to claim 1, wherein each of the at least two light shielding films has a different thickness.

12. The solid-state imaging device according to claim 1, wherein each of the at least two light shielding films is formed using a single material.

13. The solid-state imaging device according to claim 1, wherein each of the at least two light shielding films is formed using at least two different materials.

14. A method of manufacturing a solid-state imaging device, comprising:
forming a photoelectric conversion film on an upper side of a semiconductor substrate; and
forming at least two light shielding films at positions higher than the photoelectric conversion film with respect to the semiconductor substrate,
wherein one of the at least two light shielding films covers an end face on an effective pixel region side of another one of the at least two light shielding films.

15. The method according to claim 14, wherein the at least two light shielding films have an opening in an entire region of the effective pixel region.

16. The method according to claim 14, wherein the at least two light shielding films have openings for respective pixels in the effective pixel region, and include an inter-pixel light shielding film.

17. The method according to claim 14, further comprising forming a sealing film between respective light shielding films of the at least two light shielding films.

18. An electronic apparatus comprising
a solid-state imaging device including:
a photoelectric conversion film formed on an upper side of a semiconductor substrate; and
at least two light shielding films formed at positions higher than the photoelectric conversion film with respect to the semiconductor substrate,
wherein one of the at least two light shielding films covers an end face on an effective pixel re ion side of another one of the at least two light shielding films.

19. The electronic apparatus according to claim 18, wherein the at least two light shielding films have an opening in an entire region of the effective pixel region.

20. The electronic apparatus according to claim 18, wherein the at least two light shielding films have openings for respective pixels in the effective pixel region, and include an inter-pixel light shielding film.

* * * * *